(12) United States Patent
Okamoto et al.

(10) Patent No.: US 7,046,008 B2
(45) Date of Patent: May 16, 2006

(54) RADIO-FREQUENCY COIL APPARATUS

(75) Inventors: Kazuya Okamoto, Saitama (JP); Mitsuo Takagi, Otawara (JP); Hiroyuki Fujita, Highland Heights, OH (US)

(73) Assignees: Toshiba Medical Systems Corporation, Otawara (JP); USA Instruments, Inc., Aurora, OH (US)

( * ) Notice: Subject to any disclaimer, the term of this patent is extended or adjusted under 35 U.S.C. 154(b) by 0 days.

(21) Appl. No.: 10/835,261

(22) Filed: Apr. 30, 2004

(65) Prior Publication Data

US 2005/0242812 A1 Nov. 3, 2005

(51) Int. Cl.
*G01V 3/00* (2006.01)

(52) U.S. Cl. ...................... 324/322; 324/318
(58) Field of Classification Search ................ 324/318, 324/319, 322, 309, 317; 600/410, 422; 128/653.5
See application file for complete search history.

(56) References Cited

U.S. PATENT DOCUMENTS

| | | | | |
|---|---|---|---|---|
| 5,139,024 A | * | 8/1992 | Bryant et al. ................ | 600/422 |
| 5,363,845 A | * | 11/1994 | Chowdhury et al. ......... | 600/422 |
| 5,804,969 A | * | 9/1998 | Lian et al. ................... | 324/318 |
| 6,577,888 B1 | * | 6/2003 | Chan et al. ................. | 600/422 |
| 6,591,128 B1 | * | 7/2003 | Wu et al. .................... | 600/422 |

* cited by examiner

*Primary Examiner*—Brij B. Shrivastav
(74) *Attorney, Agent, or Firm*—Nixon & Vanderhye P.C.

(57) ABSTRACT

A radio-frequency coil apparatus includes a first unit including a first radio-frequency coil that receives a magnetic resonance signal emitted from a subject, a second unit including a second radio-frequency coil that receives the magnetic resonance signal, independently from the first radio-frequency coil. The first unit and the second unit are supported by a support member. The support member is attachable/detachable to/from at least one of the first unit and the second unit. The support member is configured to be able to change the relative positions of the first unit and the second unit.

6 Claims, 3 Drawing Sheets

RADIO-FREQUENCY COIL APPARATUS

BACKGROUND OF THE INVENTION

1. Field of the Invention

The present invention relates to a radio-frequency coil apparatus that is used in a magnetic resonance imaging apparatus for imaging the inside of the body of a subject, on the basis of a magnetic resonance signal emitted from the subject.

2. Description of the Related Art

In a magnetic resonance imaging (MRI) apparatus, a radio-frequency (RF) coil receives a magnetic resonance signal that is emitted from a subject. A whole body coil receives a magnetic resonance signal from a wide region of about 50 cm. On the other hand, a local RF coil for imaging a local region such as the head, knee or spine receives a magnetic resonance signal from only a narrow region corresponding to the size of a region to be imaged. By narrowing the range of reception, the sensitivity of radio reception can be enhanced.

Local RF coils are custom-designed so as to be suited to regions to be imaged. At the actual place for clinical treatment, a suitable local RF coil for the region to be imaged is selected and used.

In the actual clinical treatment, there is such a case that the head is first imaged and then the neck region is imaged, or the liver region is imaged and then the pelvis is imaged. In such a case, the doctor or operator has to perform such a process as replacement of the RF coil for imaging the head with the RF coil for imaging the neck region and chest region. This is a time-consuming process for the doctor or operator. Besides, this process may possibly require movement of the subject, which is laborious for the subject.

BRIEF SUMMARY OF THE INVENTION

Under the above-described circumstances, there is a demand for a technique that enables imaging with use of plural kinds of local RF coils, without the need to replace these coils.

According to first aspect of the present invention, there is provided a radio-frequency coil apparatus for use in a magnetic resonance imaging apparatus that images an inside of a subject on the basis of a magnetic resonance signal emitted from the subject, comprising: a first unit including a first radio-frequency coil that receives the magnetic resonance signal; a second unit including a second radio-frequency coil that receives the magnetic resonance signal, independently from the first radio-frequency coil, and a support member that is configured to be attachable/detachable to/from at least one of the first unit and the second unit, and supports the first unit and the second unit such that relative positions of the first unit and the second unit are interchangeable.

According to second aspect of the present invention, there is provided a radio-frequency coil apparatus for use in a magnetic resonance imaging apparatus that images an inside of a subject on the basis of a magnetic resonance signal emitted from the subject, comprising: a first unit including a first radio-frequency coil that receives the magnetic resonance signal emitted from the head of the subject, a second unit that is attachable/detachable to/from the first unit and includes a second radio-frequency coil which receives the magnetic resonance signal emitted from any one of the neck, the chest and the upper spine of the subject, independently from the first radio-frequency coil.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings. RF coil apparatuses according to the embodiments described below are attached, in use, to an MRI apparatus (not shown).

(First Embodiment)

Figure 1:
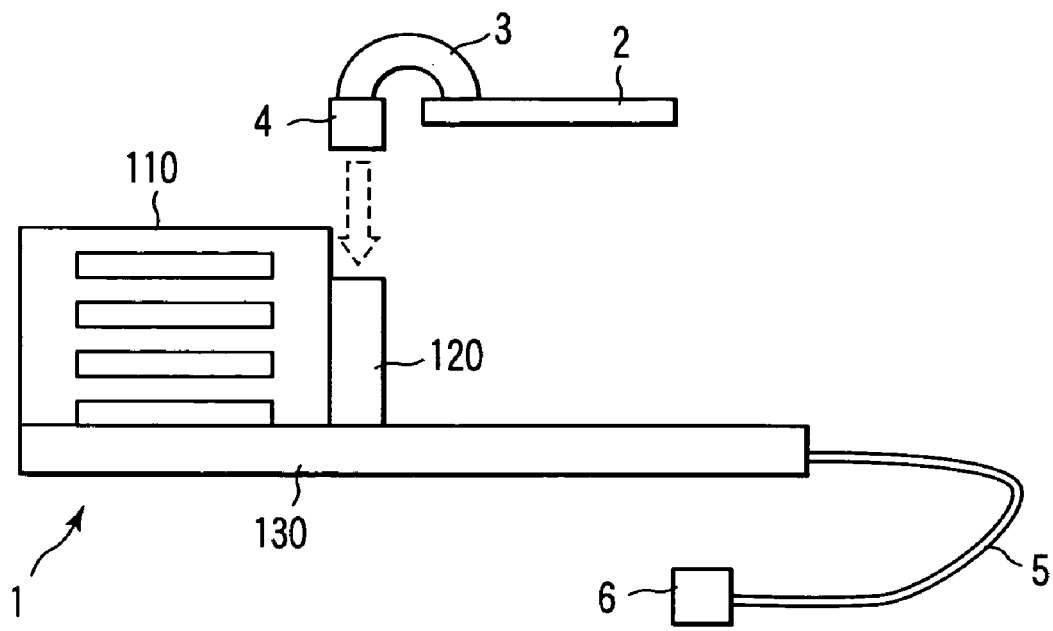
FIG. 1 shows the structure of an RF coil apparatus according to a first embodiment of the present invention.

FIG. 1 shows the structure of an RF coil apparatus according to a first embodiment of the present invention.

The RF coil apparatus according to the first embodiment, as shown in FIG. 1, comprises a main unit 1, an additional unit 2, a support member 3, a connector 4, a cable 5 and a system connector 6. The main unit 1 comprises a local RF coil 110, a connector port 120 and a space 130.

In this embodiment, the local RF coil 110 is an RF coil for imaging the head. The local RF coil 110 has a substantially hollow cylindrical shape. The local RF coil 110 receives a magnetic resonance signal, which is emitted from a subject's head placed within the coil 110. The connector port 120 is made integral with or fixed to the local RF coil 110. The connector 4 is connectable to the connector port 120. The space 130 has a box shape with a flat upper surface. The local RF coil 110 and connector port 120 are disposed on the upper surface of the space 130. Thus, the space 130 serves as a base when the RF coil apparatus is attached to the MRI apparatus. Signal lines and circuit components are accommodated in the space 130.

The additional unit 2 has a rectangular casing that contains an additional coil (not shown in FIG. 1). The additional coil receives a magnetic resonance signal that is emitted from a subject's region other than the head. The range of radiation reception of the additional coil can freely be set by adjusting, e.g. the size of the additional coil. The range of radiation reception of the additional coil covers, for instance, the neck region, chest region, upper chest region, the front side of the upper chest region, etc.

The support member 3 is a flexible member. The support member 3 is formed in a tubular shape, for example, by coupling a number of short cylindrical components. One end of the support member 3 is connected to the additional unit 2, and the other end of the support member 3 is connected to the connector 4. Signal lines for connecting the additional coil and connector 4 are accommodated within the support member 3.

When the connector 4 is connected to the connector port 120, the connector 4 fixes one end of the support member 3 to the main unit 1 and connects the signal lines within the main unit 1 to the signal lines within the support member 3.

The cable 5 includes signal lines that are connected to the local RF coil 110 and signal lines that are connected to the connector port 120. These signal lines are connected to the system connector 6 that is provided at the end of the cable 5.

The system connector 6 is connectable to a connector (not shown) provided on the MRI apparatus. When the system connector 6 is connected to the connector of the MRI apparatus, the system connector 6 connects the signal lines contained within the cable 5 to electric circuits within the MRI apparatus.

Figure 2:
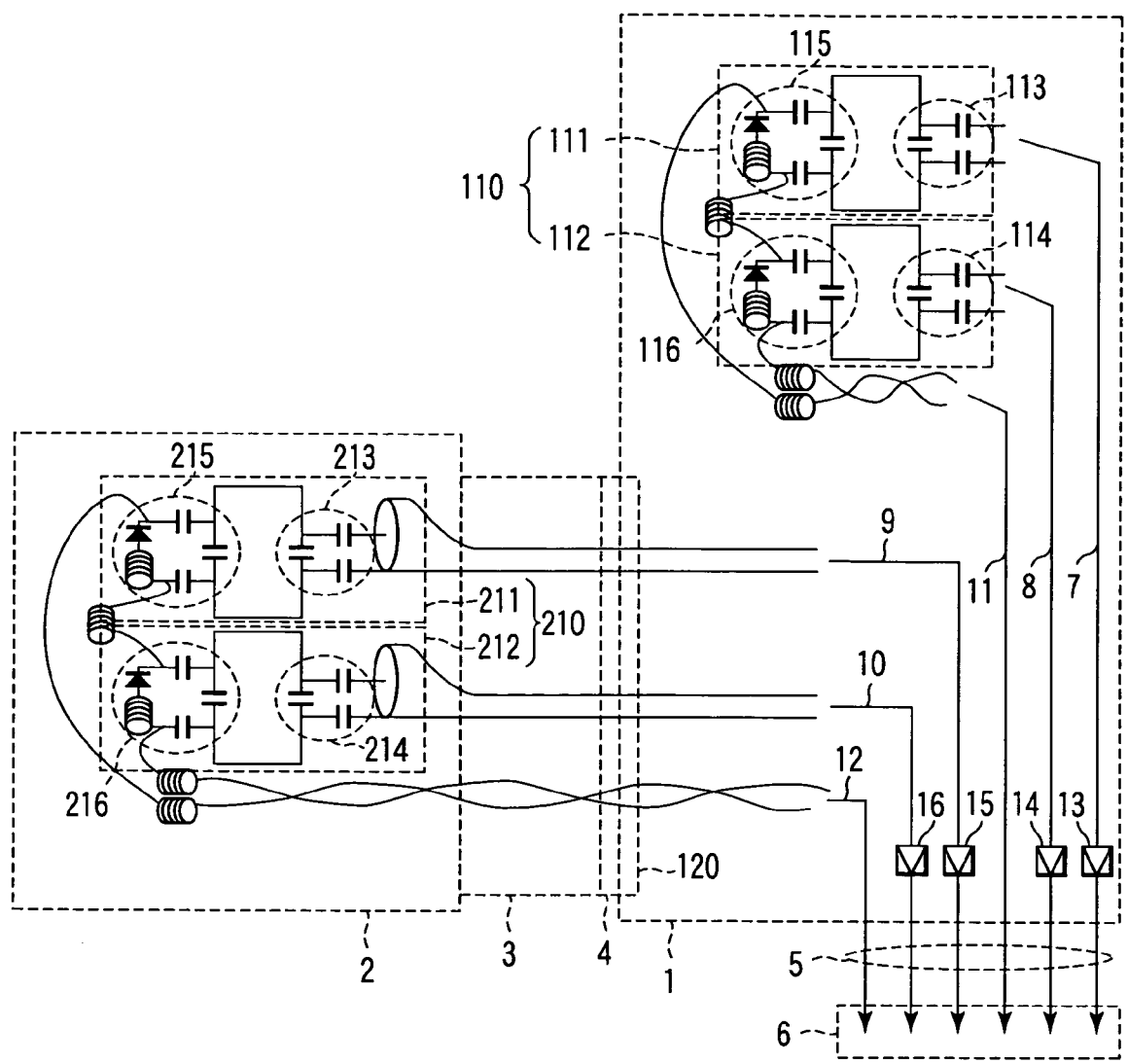
FIG. 2 shows the structure of electric circuits that are mounted in the RF coil apparatus shown in FIG. 1.

FIG. 2 shows the structure of electric circuits that are mounted in the RF coil apparatus shown in FIG. 1. The same reference numerals of FIG. 1 designate the same or corresponding parts on FIG. 2.

FIG. 2 shows an example of configuration wherein array coils are used as the local RF coil 110 and additional coil 210. The local RF coil 110 comprises two surface coils 111 and 112. The surface coils 111 and 112 include matching circuits 113 and 114 and trap circuits 115 and 116, respectively. The additional coil 210 comprises two surface coils 211 and 212. The surface coils 211 and 212 include matching circuits 213 and 214 and trap circuits 215 and 216, respectively.

The surface coils 111, 112, 211 and 212 convert magnetic resonance signals to electric signals (RF signals). The surface coils 111, 112, 211 and 212 are connected to signal lines 7, 8, 9 and 10 via the matching circuits 113, 114, 213 and 214. The signal lines 7 and 8 are connected to the MRI apparatus via preamplifiers 13 and 14, cable 5 and system connector 6. The signal lines 9 and 10 are connected to the MRI apparatus via the support member 3, connector 4, connector port 120, preamplifiers 15 and 16, cable 5 and system connector 6.

The trap circuits 115, 116, 215 and 216 render the surface coils 111, 112, 211 and 212 non-sensitive while an RF magnetic field is being applied to the subject. The trap circuits 115, 116, 215 and 216 are ON/OFF controlled by control signals that are sent from the MRI apparatus. The control signal for the trap circuits 115 and 116 are transmitted via a pin diode control line 11 that is a dedicated signal line. The pin diode control line 11 is connected to the MRI apparatus via the cable 5 and system connector 6. The control signal for the trap circuits 215 and 216 are transmitted via a pin diode control line 12 that is a dedicated signal line. The pin diode control line 12 is connected to the MRI apparatus via the support member 3, connector 4, connector port 120, cable 5 and system connector 6.

The preamplifiers 13 to 16 are designed to amplify magnetic resonance signals of a small magnitude. They amplify RF signals that are to be sent to the cable 5. The preamplifiers 13 to 16 are disposed, for example, within the space 130. Alternatively, the preamplifiers 13 to 16 may be disposed at an obstacle-free position within the local RF coil 110 or disposed at some point in the cable 5.

The RF coil apparatus according to the first embodiment with the above-described structure is usable in first and second states of use, as described below.

In the first state of use, the main unit 1 alone is mounted on a predetermined position on the MRI apparatus, and the system connector 6 is connected to the connector port on the MRI apparatus side. As is understood from FIG. 2, if the system connector 6 is attached to the MRI apparatus, the main unit 1 is connected to the MRI apparatus via the signal lines 7 and 8 and pin diode control line 11 for the local RF coil 110. This connection is established regardless of whether or not the connector 4 is connected to the connector port 120. In the first state of use, the head of the subject can be imaged.

Figure 3:
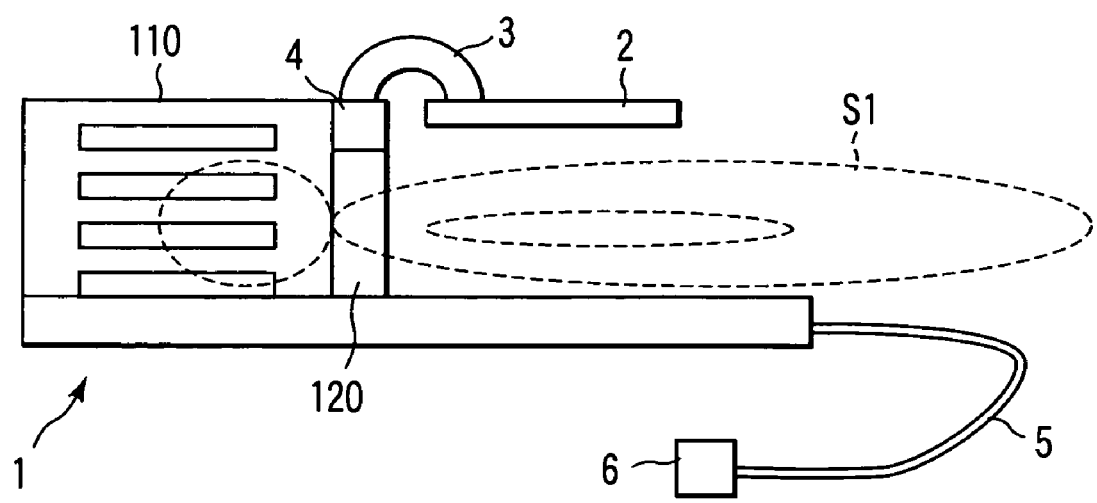
FIG. 3 shows a second state of use of the RF coil apparatus shown in FIG. 1.

In the second state of use, as shown in FIG. 3, the additional unit 2 is mounted. Specifically, the connector 4 is connected to the connector port 120. In the second state of use, the additional unit 2 is supported on the main unit 1 by the connector 4 and support member 3.

As is shown in FIG. 3, in the second state of use, the head can be imaged using the local RF coil 110. In addition, the upper chest region, for instance, can be imaged using the additional coil 210. In short, the region for imaging can be increased to cover the head and the upper chest.

As is understood from FIG. 2, the signal lines 9 and 10 and pin diode control line 12 of the additional coil 210 pass through the main unit 1, but they are wired as a separate system from the system of the signals 7 and 8 and pin diode control line 11. In the second state of use, it is possible to image the chest region alone using the additional coil 210, without imaging the head.

Figure 4:
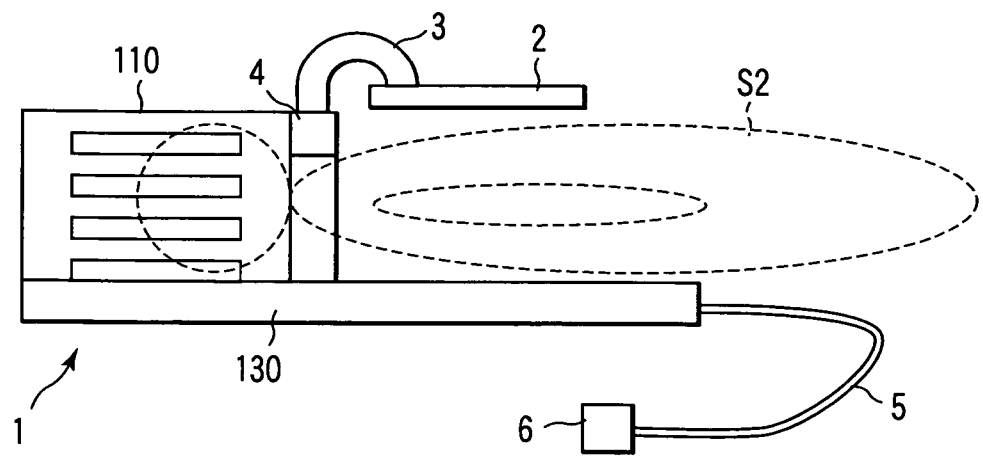
FIG. 4 shows the second state of use of the RF coil apparatus shown in FIG. 1.

The support member 3 is flexible. The position of the additional unit 2, relative to the main unit 1, can be altered. In accordance with the figure of the subject, the height and angle of the additional unit 2 can flexibly be adjusted. For example, in FIG. 4, the position of the additional unit 2 is shifted upward, compared to the position shown in FIG. 3, since the size of a subject S2 is greater than the size of a subject S1 shown in FIG. 3. The distance between the additional coil 210 and the subject can optimally be adjusted, and this makes it possible to acquire a magnetic resonance signal with high sensitivity, without an effect due to the size of the subject.

The signal lines 7 and 8 and pin diode control line 11 for connection between the local RF coil 110 and MRI apparatus and the signal lines 9 and 10 and pin diode control line 12 for connection between the additional coil 210 and MRI apparatus are accommodated in the cable 5 and are connected to the MRI apparatus via the system connector 6. Thus, it is only the cable 5 that connects the RF coil apparatus and MRI apparatus, and the handling of the apparatus is easy.

(Second Embodiment)

Figure 5:
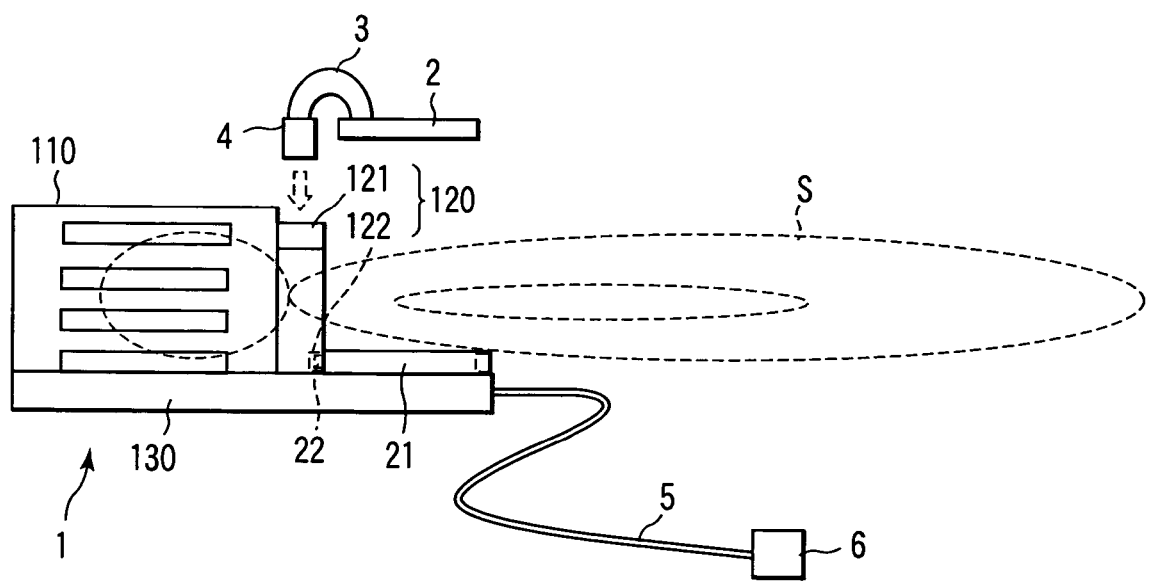
FIG. 5 shows the structure of an RF coil apparatus according to a second embodiment of the present invention.

FIG. 5 shows the structure of an RF coil apparatus according to a second embodiment of the present invention. The same reference numerals of FIG. 1 designate the same or corresponding parts on FIG. 5, and a detailed description thereof is omitted.

The RF coil apparatus according to the second embodiment, as shown in FIG. 5, comprises a main unit 1, an additional unit 2, a support member 3, a connector 4, a cable 5, a system connector 6, an additional unit 21 and a connector 22.

The main unit 1 has a connector port 120 that comprises two connector ports 121 and 122. The connector port 121 is fixed to the local RF coil 110. The connector 4 is connectable to the connector port 121. The connector 22 is connectable to the connector port 122. The connector port 122 is provided at such a position that the connector 22 is connectable to the connector port 122 in the state in which the additional unit 21 is mounted on the upper surface of the space 130. The additional coil contained in the additional unit 2 is so configured as to receive a magnetic resonance signal that is emitted from the front side of the upper chest region. The additional coil contained in the additional unit 21 is so configured as to receive a magnetic resonance signal that is emitted from the region extending from the backside of the neck to the backside of the upper chest.

The additional unit 21 can be provided in the space 130. In this case, neither the connector port 122 nor the connector 22 are required.

The RF coil apparatus according to the second embodiment with the above-described structure is available in a third state and a fourth state of use, in addition to the two states of use: the first and second states of use in the first embodiment.

In the third state of use, the additional unit 21 alone is attached to the main unit 1. Specifically, the connector 22 is connected to the connector port 120.

In the third state of use, a region from the backside of the neck to the upper spine or upper c-spine, for instance, can be imaged using the additional coil contained in the additional unit 21, in addition to the imaging that is feasible in the first state of use in the first embodiment. In short, the region for imaging can be increased to cover such a range as to extend from the head to upper spine or upper c-spine.

In the fourth state of use, the additional unit 21 is mounted in addition to the second state of use in the first embodiment. Specifically, the connector 4 is connected to the connector port 121, and the connector 22 is connected to the connector port 122.

In the fourth state of use, the region extending from the backside of the neck to the backside of the upper chest can be imaged using the additional coil contained in the additional unit 21, in addition to the imaging that is feasible in the second state of use in the first embodiment. In short, the region for imaging can be increased to cover such a range as to extend from the head to the chest. The front side and backside of the chest can be imaged using different coils. In particular, coils with sensitivity to this region are referred to as "neurovascular coils".

According to each of the above-described embodiments, high-sensitivity imaging can be performed using the RF coil with a limited range of reception of a magnetic resonance signal. Furthermore, an imaging operation using a plurality of RF coils can be successively performed without the need to conduct a process for replacing the RF coil. This reduces a burden on the doctor, operator or subject S due to the replacement process of RF coils.

Various modifications, as described below, may be made to the above-described embodiments.

In each of the embodiments, a connector and a connector port for a signal line, which are different from the connectors 4 and 22 and connector port 120 may be provided, and the signal line may be connected via these connector and connector ports.

The local RF coil 110 and other additional coils may be formed of various kinds of coils, other than array coils.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio-frequency coil apparatus for use in a magnetic resonance imaging apparatus that images a subject volume using a magnetic resonance signal emitted therefrom, said apparatus comprising:
    a first unit including a first radio-frequency coil that receives a magnetic resonance signal;
    a second unit including a second radio-frequency coil that receives a magnetic resonance signal, independently from the first radio-frequency coil;
    a support member that is configured to be attachable/detachable to/from at least one of the first unit and the second unit, and that supports the first unit and the second unit such that relative positions of the first unit and the second unit are interchangeable;
    a cable that is connected to the first unit and the magnetic resonance imaging apparatus,
    a first signal line accommodated in the cable and configured to transmit a signal between the first radio-frequency coil and the magnetic resonance imaging apparatus wherein the first signal line is connectable to the magnetic resonance imaging apparatus in a state in which the second unit is not supported on the first unit by the support unit; and
    a second signal line accommodated in the cable internally of the first unit and configured to transmit a signal between the second radio-frequency coil and the magnetic resonance imaging apparatus.

2. A radio-frequency coil apparatus for use in a magnetic resonance imaging apparatus that images a subject volume using a magnetic resonance signal emitted therefrom, said apparatus comprising:
    a first unit including a first radio-frequency coil that receives a magnetic resonance signal;
    a second unit including a second radio-frequency coil that receives a magnetic resonance signal, independently from the first radio-frequency coil;
    a support member that is configured to be attachable/detachable to/from at least one of the first unit and the second unit, and that supports the first unit and the second unit such that relative positions of the first unit and the second unit are interchangeable;
    a third unit including a third radio-frequency coil that receives a magnetic resonance signal, independently from the first and second radio-frequency coils;
    the third unit being attachable to the first unit;
    a first signal line that transmits a signal between the first radio-frequency coil and the magnetic resonance imaging apparatus;
    a second signal line that transmits a signal between the second radio-frequency coil and the magnetic resonance imaging apparatus; and
    a third signal line that transmits a signal between the third radio-frequency coil and the magnetic resonance imaging apparatus,
    wherein the first signal line is connectable to the magnetic resonance imaging apparatus in a state in which the second unit is not supported on the first unit by the support member, and/or the third unit is not mounted on the first unit.

3. The radio-frequency coil apparatus according to claim 2, further comprising:
    a cable that is connected to the first unit and the magnetic resonance imaging apparatus, wherein the first signal line is accommodated in the cable, and the second and third signal lines are accommodated in the cable via an inside of the first unit.

4. A radio-frequency coil apparatus for use in a magnetic resonance imaging apparatus that images a subject volume using a magnetic resonance signal emitted therefrom, said apparatus comprising:

a first unit including a first radio-frequency coil that receives a magnetic resonance signal emitted from the head of the subject;

a second unit that is attachable/detachable to/from the first unit and includes a second radio-frequency coil which receives a magnetic resonance signal emitted from any one of the neck, the chest and the upper spine of the subject, independently from the first radio-frequency coil;

a cable that is connected to the first unit and the magnetic resonance imaging apparatus, a first signal line accommodated in the cable and configured to transmit a signal between the first radio-frequency coil and the magnetic resonance imaging apparatus wherein the first signal line is connectable to the magnetic resonance imaging apparatus in a state in which the second unit is not mounted on the first unit; and a second signal line accommodated in the cable internally of the first unit and configured to transmit a signal between the second radio-frequency coil and the magnetic resonance imaging apparatus.

5. A radio-frequency coil apparatus for use in a magnetic resonance imaging apparatus that images a subject volume using a magnetic resonance signal emitted therefrom, said apparatus comprising:

a first unit including a first radio-frequency coil that receives a magnetic resonance signal emitted from the head of the subject;

a second unit that is attachable/detachable to/from the first unit and includes a second radio-frequency coil which receives a magnetic resonance signal emitted from any one of the neck, the chest and the upper spine of the subject, independently from the first radio-frequency coil;

a third unit that images the neck and upper spine area that is attachable to the first unit and includes a third radio-frequency coil which receives, independently from the first and second radio-frequency coils, a magnetic resonance signal emitted from a region of the subject, the region of the subject being different from the regions of the subject which emit the magnetic resonance signals that are received by the first and second radio-frequency coils;

a first signal line that transmits a signal between the first radio-frequency coil and the magnetic resonance imaging apparatus;

a second signal line that transmits a signal between the second radio-frequency coil and the magnetic resonance imaging apparatus; and a third signal line that transmits a signal between the third radio-frequency coil and the magnetic resonance imaging apparatus, wherein the first signal line is connectable to the magnetic resonance imaging apparatus in a state in which the second unit is not mounted on the first unit, and/or the third unit is not mounted on the first unit.

6. The radio-frequency coil apparatus according to claim 5, further comprising:

a cable that is connected to the first unit and the magnetic resonance imaging apparatus, wherein the first signal line is accommodated in the cable, and the second and third signal lines are accommodated in the cable via an inside of the first unit.

* * * * *